(12) United States Patent
Liu et al.

(10) Patent No.: US 6,855,967 B2
(45) Date of Patent: Feb. 15, 2005

(54) UTILIZATION OF MACRO POWER ROUTING AREA FOR BUFFER INSERTION

(75) Inventors: Louis Chao-Chiuan Liu, Hsin-Chu (TW); Chien-Wen Chen, Hsin-Chu (TW)

(73) Assignee: Taiwan Semiconductor Manufacturing Company, Hsin-Chu (TW)

(*) Notice: Subject to any disclaimer, the term of this patent is extended or adjusted under 35 U.S.C. 154(b) by 55 days.

(21) Appl. No.: 10/283,892

(22) Filed: Oct. 30, 2002

(65) Prior Publication Data

US 2003/0049891 A1 Mar. 13, 2003

Related U.S. Application Data

(62) Division of application No. 09/747,136, filed on Dec. 26, 2000, now Pat. No. 6,492,205.

(51) Int. Cl.⁷ .................. H01L 27/10; H01L 23/52; H01L 23/04; H01L 23/48
(52) U.S. Cl. .............. 257/207; 257/203; 257/208; 257/210; 257/211; 257/691; 257/698; 257/750; 257/774
(58) Field of Search ................ 257/203, 204, 257/207, 208, 758

(56) References Cited

U.S. PATENT DOCUMENTS

| | | | |
|---|---|---|---|
| 5,045,725 A | * | 9/1991 | Sasaki et al. .................. 326/37 |
| 5,313,079 A | | 5/1994 | Brasen et al. ................ 257/206 |
| 5,341,049 A | * | 8/1994 | Shimizu et al. .............. 326/101 |
| 5,343,058 A | | 8/1994 | Shiffer, II .................... 257/204 |
| 5,619,048 A | * | 4/1997 | Yokota et al. ............... 257/207 |
| 5,869,900 A | | 2/1999 | Crafts .......................... 257/758 |
| 5,923,059 A | | 7/1999 | Gheewala .................... 257/204 |

* cited by examiner

Primary Examiner—Jack Chen
Assistant Examiner—David L. Hogans
(74) Attorney, Agent, or Firm—Howard Chen

(57) ABSTRACT

A structure and a method for forming buffer cells in power line areas between macro cell in a macro block area. In a power line level, a pin is formed between VSS and VDD lines. The pin is connected to the buffer cell. Next a signal line layer is formed and the signal line is connected to the pin and to a driver. In a first embodiment the driver is formed in a standard cell area. In a second embodiment, the driver is formed in a macro cell. A signal line is connected to the pin and the driver.

2 Claims, 5 Drawing Sheets

FIG. 1 – Prior Art

UTILIZATION OF MACRO POWER ROUTING AREA FOR BUFFER INSERTION

This is a division of patent application Ser. No. 09/747,136, filing date Dec. 26, 2000 U.S. Pat. No. 6,492,205, Utilization Of Macro Power Routing Area For Buffer Insertion, assigned to the same assignee as the present invention.

BACKGROUND OF INVENTION

1) Field of the Invention

This invention relates generally to fabrication of semiconductor devices having macro cells, power lines and repeater cells and more particularly to the layout and method forming placing the repeater cell in between macro cells and modifying the power lines to place a Pin to the repeater cells in the power line areas between macro cells. Furthermore, the invention relates generally to fabrication and design of semiconductor devices and more particularly to the fabrication and design of power routing (VDD and VSS) and the location of buffer cells in macro cell areas.

2) Description of the Prior Art

The cells of a standard cell area normally contain a simple logic function, such as an inverter, a NAND gate, or a D-flip flop. The transistors in these cells are specifically designed for the drive requirements of the particular cell, and spacing of these transistors depend upon factors such as the location of contacts within the cells.

The spacing, or pitch, between rows of cells is determined by (a) the number of interconnect lines fabricated from METAL and (b) the cell height. The cell height, in turn, depends upon the transistor configuration within the cells.

The interconnect lines fabricated from METAL are typically laid out by an automated device, or computer program, called a "router," or "auto-router." Different routers have different algorithms for laying out the lines, so that different routers will produce different interconnect patterns, even though the end result of the connections may be the same.

Thus, in general, the row pitch is determined by (a) the router used to interconnect the cells in the standard cell array and (b) the height of the individual cells.

It is very important to efficiently arrange the wiring in an IC because, in general, the wiring running from transistor-to-transistor consumes more space than the transistors themselves. (The wiring consists of traces fabricated from the METAL layers) Restated, the size of the IC is generally determined by how efficiently the wiring can be routed and compacted, and not by how many transistors the IC contains. Embedding MACROs into Standard Cell Arrays Uses Space MACROs are frequently incorporated into ICs containing standard cell arrays. A MACRO is a block of transistors which have been optimized to perform a specific function. In a MACRO, the layout of the individual transistors, their operating characteristics, and their interconnections may have all been matched to each other for optimum performance. Thus, typically, a MACRO is constructed from different sizes of transistors, which are embedded into the standard cell array.

Since, in general, the ROW PITCH of the MACRO is different from that of the standard cell array, the power busses Vdd and Vss will be interrupted. To accommodate this interruption, the power busses are re-designed into a ring that surrounds a macro.

Power routing, in today's SOC chips consumes a lot of chip area, especially for designs including many macro blocks such as SRAM, Flash and Mixed-Signal blocks. Usually a power ring needs to be routed around each of the macros in order to connect to all power pins of the macro. The result is that the area around the macros will be occupied by the power ring and no standard cells can be placed in that area.

For designs containing many macros the macros are often placed next to each other in groups. The spaces between the macros are used for power routing. The result is that the macro's and their surrounding power rings will form big areas on the chip in which no standard cells can be placed. Long nets which needs to be routed over these areas must therefore travel a long distance without additional buffering (repeater), causing extensive delays.

The options available today are:

1) Create extra space between each macro to allow for standard cell rows to be placed. The buffer cells are then placed in these standard cell rows. This solution will sacrifice some areas.
2) Route the net around the macro's. This will make it possible to insert additional buffers since the net will be routed over the standard cell area. However, the net will be longer than routing across the macro's.
3) Use very high drive cells on the driver end of the net. This will improve net delay, but will have limited effect when the net reaches a certain length.

The importance of overcoming the various deficiencies noted above is evidenced by the extensive technological development directed to the subject, as documented by the relevant patent and technical literature. The closest and apparently more relevant technical developments in the patent literature can be gleaned by considering U.S. Pat. No. 5,923,059(Gheewala) teaches a power routing (e.g., M1 M2-Vdd and Vss) that do not cross over macro cells.

U.S. Pat. No. 5,313,079(Brazen et al.) shows a gate array with flexible routing.

U.S. Pat. No. 5,869,900(Crafts) and U.S. Pat. No. 5,343,058(Shiffer, II) show related layouts and routings.

SUMMARY OF THE INVENTION

It is an object of the present invention to provide a method for fabricating and a design for power routing for semiconductor chips having macro areas.

It is an object of the present invention to provide a method for fabricating and a design for power routing for semiconductor chips having macro areas where the buffer cells are inserted between the power lines over macro cell areas.

To accomplish the above objectives, the present invention provides a structure and method for forming buffer cells in power line areas between macro cell in a macro block area on a substrate. In a power line level, a pin is formed between VSS and VDD lines. The pin is connected to the buffer cell. Next a signal line layer is formed and the signal line is connected to the pin and to a driver. In a first embodiment the driver is formed in a standard cell area on the substrate. In a second embodiment, the driver is formed in a macro cell on a substrate.

The preferred first embodiment of the invention provides a method of fabrication of buffer cells in power line areas between macro cells in a macro area in a semiconductor device. The invention's buffer cell is in a power line area 32 within a macro area. A key feature of the first embodiment is the placement of the buffer cell in the power line area within a macro area. In contrast, normally, buffer cells are located in the standard cell area or in the macro cell areas.

The second embodiment has a weak driver in a macro cell. Like the first embodiment, the buffer cell is in the power line area. The pin is electrically connected to the buffer cell. The signal line is connected to the drive and the pin which is connected to the buffer cell.

The two embodiments of the present invention provide the following benefits.

1. A way of utilizing power routing area for buffer insertion
2. A way of saving total chip area
3. A way of decreasing signal delays for long nets
4. A way of generating special cell layout fit to be placed under power lines.
5. A way of placing cells under power lines.

By using the invention's special buffer cells, which are laid out so that it can be placed under the power lines and by placing, these buffer cells in the power line area between the macros, signals that travel a long distance across macro areas can be repeated. This will decrease the signal delay for long wires crossing macro areas and improve overall design performance without sacrificing any area.

Additional objects and advantages of the invention will be set forth in the description that follows, and in part will be obvious from the description, or may be learned by practice of the invention. The objects and advantages of the invention may be realized and obtained by means of instrumentalities and combinations particularly pointed out in the claims.

BRIEF DESCRIPTION OF THE DRAWINGS

The features and advantages of a semiconductor device according to the present invention and further details of a process of fabricating such a semiconductor device in accordance with the present invention will be more clearly understood from the following description taken in conjunction with the accompanying drawings in which like reference numerals designate similar or corresponding elements, regions and portions and in which:

FIG. 1 shows a power layout according to a prior art method known to the inventors.

DETAILED DESCRIPTION OF THE PREFERRED EMBODIMENTS

A. Problem Invention Solves

Figure 2A:
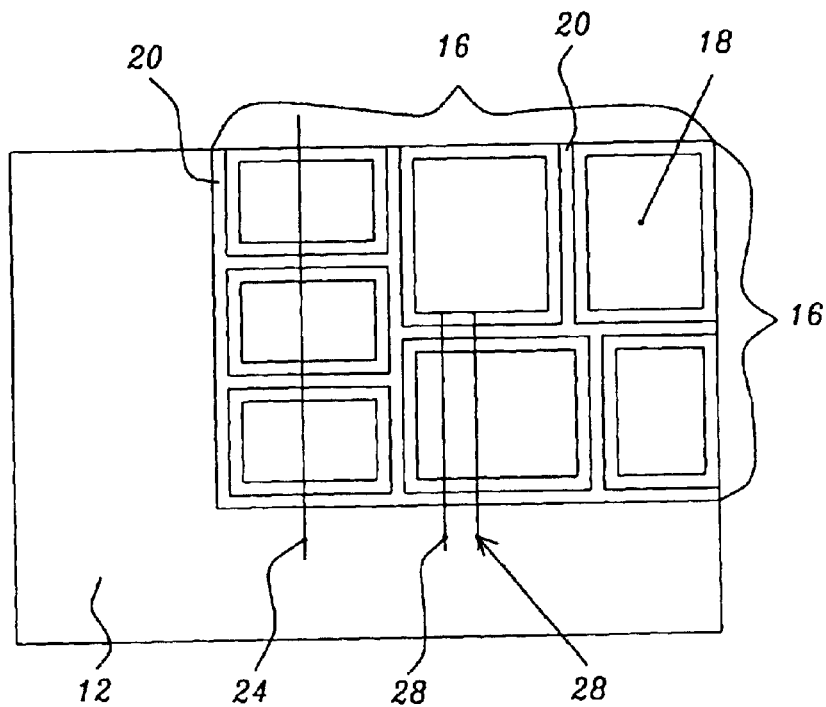
FIG. 2A show a top plan view of VSS and VDD 208 lines at the power line level according the prior art.

Referring now to the drawing and more particularly to FIG. 1, there is shown a power structure over which the present invention is an improvement. FIG. 1 shows a power layout known to the inventor according to a prior art method known to the inventors. It is to be understood in this regard that no portion of FIG. 1 is admitted to be prior art to the present invention. Rather, this highly simplified diagram is an effort to provide an improved understanding of the problems that are overcome by the invention.

FIG. 1 shows a macro area 16 and standard cell area 12. The macro area contains macro cells 18 and are spaced apart by a signal line 24 which crosses over the macro area. A problem with this signal line 24 is the long signal delay caused by a long net (high capacitance).

Signal lines 28 also cross the macro area 16. These signal lines 28 are driven by a macro. However, the macro is only a weak driver because it is not designed to drive a long net. also, there is no direct buffering.

FIG. 2A show a top plan view of VSS and VDD lines according the prior art.

The invention improves upon this design.

II. Overview of the Invention

The present invention will be described in detail with reference to the accompanying drawings. A main concept with this invention is to utilize the area occupied by power lines around macro's and use the area to place a buffer (repeater) cell. The power lines are often routed so that the VDD and VSS lines travel in parallel. Normally, the layout of the standard cells allows buffers to be placed only in standard cell rows (standard cell area).

Figure 3A:
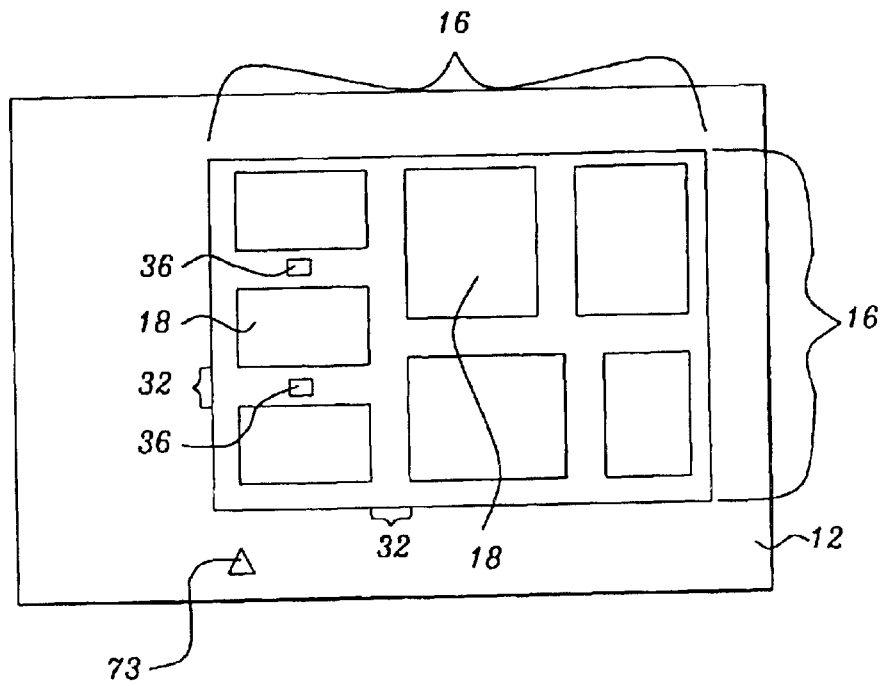
FIG. 3A illustrates a substrate level top down view the first embodiment of the invention that forms a repeater cell 36 in the power line area.

The preferred first embodiment of the invention provides a structure and a method of fabrication of buffer cells 36 in power line areas 32 between macro cells 18 in a macro area 16 (See FIG. 3A) in a semiconductor device. For example, FIG. 3A shows the invention's buffer cell 36 in power line area 32 within a macro area 16. A key feature of the first embodiment is the placement of the buffer cell 36 in the power line area 32 within a macro area 16. Normally, buffer cells are located in the standard cell area or in the macro cell areas as shown in FIG. 1.

Figure 3B:
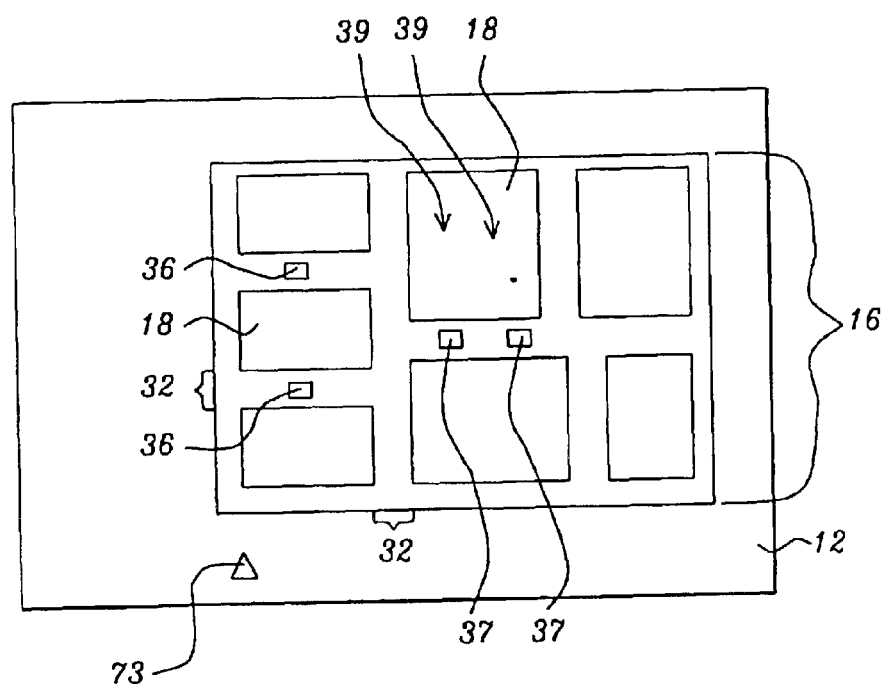
FIG. 3B illustrates the second embodiment of the invention that forms a repeater cell 37 in the power line area 32.
Figure 3C:
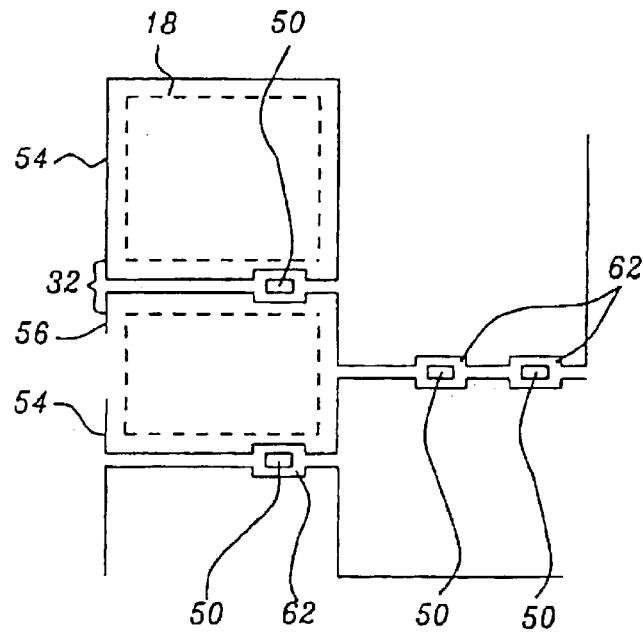
FIG. 3C shows a top down view at the power line level for the first and second embodiment.
Figure 4A:
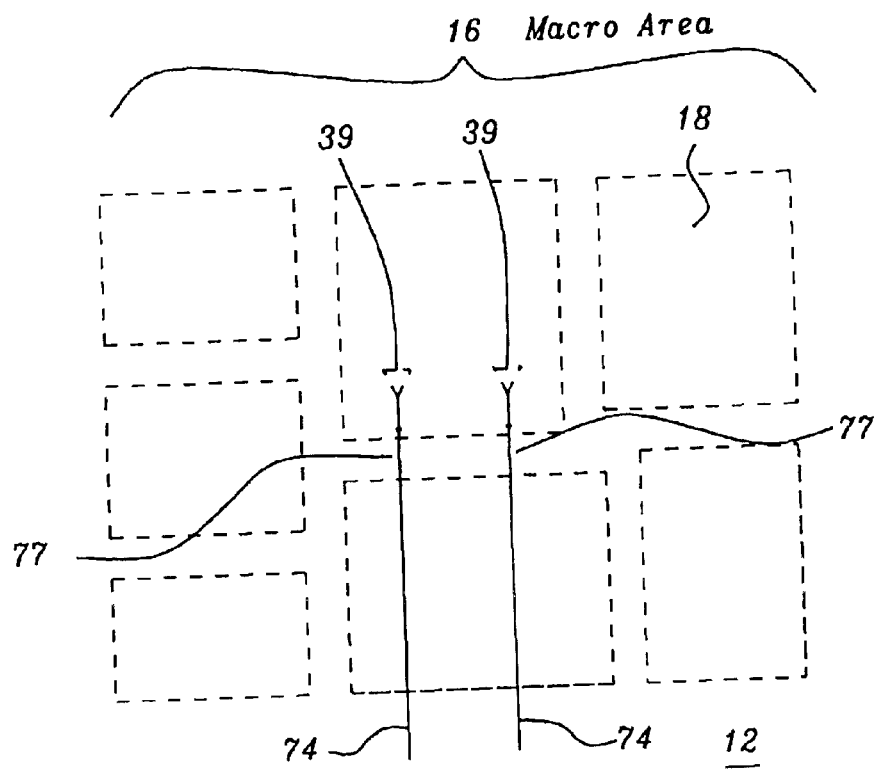
FIG. 4A shows a top down view at the signal line level view of the second embodiment.

The second embodiment has a weak driver 39 in a macro cell 18. Like the first embodiment, the buffer cell 37 is in the power line area 32 as shown in FIG. 3B. FIG. 3C thows the pin 50 that is electrically connected to the buffer cell 37. FIG. 4A showing the signal line 74 connected to the drive 39 and the pin 50 which this is connected to the buffer cell 37.

III. First Embodiment—FIG. 3A—Buffer Cell 36 in Lower Line Area 32 within a Macro Area 16

A preferred embodiment of the invention provides a method of fabrication of buffer cells 36 in power line areas 32 between macro cells 18 in a macro area 16 (See FIG. 3A) in a semiconductor device. For example, FIG. 3A shows the invention's buffer cell 36 in power line area 32 within a macro area 16. A key feature of the first embodiment is the placement of the buffer cell 36 in the power line area 32 within a macro area 16 at the substrate level. For example the buffer cell is formed in on the substrate surface and can be a FET or several FETs (comprised of source/drains, gate etc.). Buffer or repeater cells boost the signal in the signal lines. Normally, buffer cells are located in the standard cell area or in the macro cell areas as shown in FIG. 1.

As shown in FIG. 3A, a substrate is provided with a macro block area 26 and a standard cell area 12. FIG. 3A is top plan view taken at the substrate (e.g., wafer) level, and does not show overlying insulating and conductive (e.g., poly or metal layers).

Within the present invention, the substrate may be a substrate employed within a microelectronics fabrication selected from the group including but not limited to integrated circuit microelectronics fabrications, solar cell microelectronics fabrications, ceramic substrate microelectronics fabrications and flat panel display microelectronics fabrications. The substrate may be the substrate itself employed within the microelectronics fabrication, or in the alternative, the substrate may be the substrate employed within tile microelectronics fabrication, where the substrate has formed thereupon or thereover any of several additional microelectronics layers as are conventionally employed within the microelectronics fabrication. Such additional microelectronics layers may include, but are not limited to, microelectronics conductor layers, microelectronics semiconductor layers and microelectronics dielectric layers.

Macro cells 18 are provided in the macro block area 16. The macro block area is where the macro cells are concentrated. The macro cells 18 are separated by power line areas 32.

As shown in FIG. 3A, we form at least a buffer cell (repeater cell) 36 in the power lines areas 32 between the macro cells 18. All the substrate level devices (e.g., FET, cells, drivers, repeaters (buffer) can be formed using the same process steps at the same time.

Over the substrate, we form a plurality of interconnect layers over the substrate. (See FIG. 7 generally) The interconnect layers interconnect devices within the macro cells and the standard cells and provide sublevel power lines. These layers are conventional and are not shown in detail in the figures.

Figure 7:
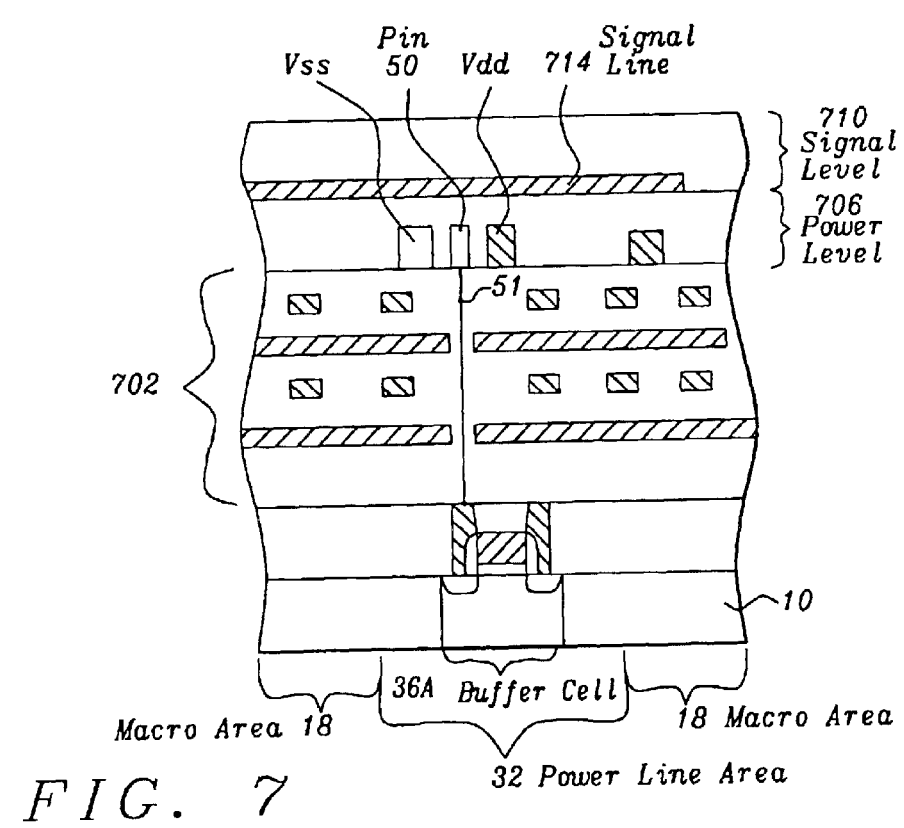
FIG. 7 shows a cross section view of the device, with buffer cell 36A in a power line area 32 along side macro area 18 according the present invention.

A. FIG. 7—Cross Sections View

FIG. 7 shows a cross section view of the device, with buffer cell 36A in a power line area 32 along side macro cells 18 on the substrate intermediate dielectric layers and metal layers 702 are formed over the substrate 10. The intermediate layers can include sublevel power lines that are connected to the overlying power lines.

Over the intermediate dielectric layers and metal layers 702, a power level layer is formed. The power level 706 is comprised of power lines and a IMD layer. The power level lines (VSS, VDD) are typically the M1, M2, M3, M4, M5, etc. Note that the power level includes a pin 50 that is electrically connected by interconnects and lines (e.g., represented by line 51).

Over the power level is the signal level 710. The signal level is comprised of a signal line 714 and a dielectric. The signal level is preferably the M2, M3, M4 or M5 level. Other conductive and insulating layer can be formed over the power level. FIG. 7 illustrates the structure of both the first and second embodiments.

B. FIG. 3C—Power Level View—Invention's Pin 50 Connects to the Buffer Cell in the Power Line Area.

Referring to FIG. 3C, we form a power level layer (e.g., Metal layer 1,2) over the plurality of interconnect layers. The power level layer comprised of YDD and VSS lines 54 56 running in parallel over the power line area 32 between the macro cells.

The power level layer is comprised of a pin 50 to connect to the buffer cell. The pin 50 is located in the power line area 32, the VDD and VSS lines 54 56 have notch areas 62 where the VDD and VSS lines do not contact the pin 50. These notch areas are shown in more detain in FIGS. 5 and 6.

Figure 3D:
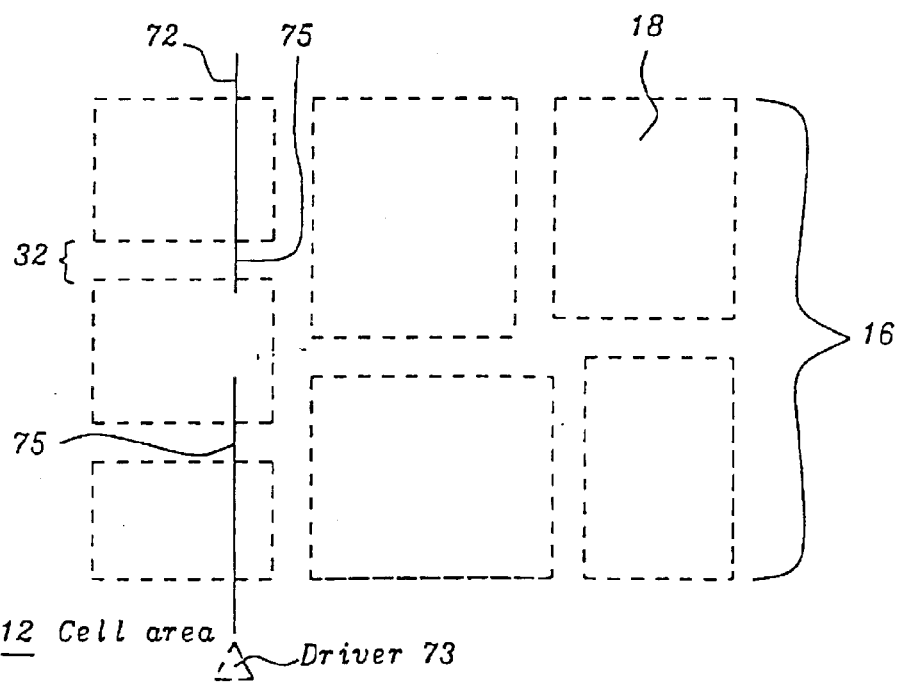
FIG. 3D shows a top down view at the signal line level view of the first embodiment.

C. FIG. 3D—Signal Line Level.

FIG. 3D shows a signal line level view of the fires embodiment. As shown in FIG. 3d, we form a signal line 72 over the macro block area 16. The signal layer is preferably a metal level (e.g., M4 level). The signal line 72 has contacts 75 to the pin 50 (See FIG. 3c) and are connected to the buffer cell (36—FIG. 3B).

The signal line 72 is connected to a driver 73 located in the standard cell area 12.

IV. (Second Embodiment)—Weak Driver 39 in the Macro Cell 18 and Buffer Cell

The second embodiment is shown in FIG. 3B, FIG. 3C and FIG. 4A. As shown in FIG. 3B, the second embodiment forms a repeater cell 37 in the power line area 32. Also weak drives 39 are formed with the macro cells. The buffer cells 36 are for the first embodiment.

Referring to FIG. 3C, power lines 56 54 are fanned with notches around a pin 50 that connects to the buffer cells 37.

Referring to FIG. 4A (signal level view), we form a signal line (off macro output) 74 over the macro block area 16.

The signal line has contacts (interconnects) 77 to the pin 50 and are connected to the buffer cell 37 (see FIG. 3b) located on the substrate surface.

The signal line (off macro output) 74 connected to a weak driver 39 located in the macro block area 16.

V. Notch Area in VSS and VDD Lines

Figure 2B:
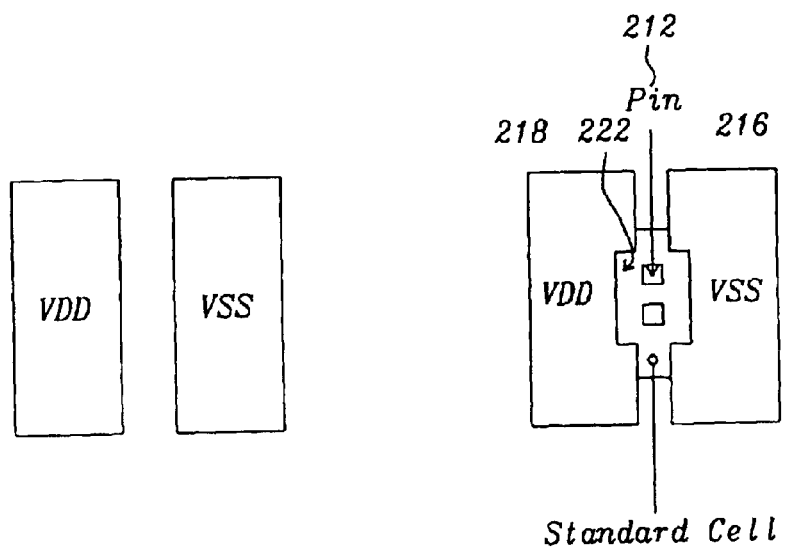
FIG. 2B shows a top plan view of the invention's VSS and VDD (power) lines 216 218 that have notches 222 at the power line level according the present invention.

FIG. 2B shows a top plan view of the invention's VSS and VDD lines 216 218 that have notches 222 according to the present invention. The pin 212 is in the notch area. The pin is over the standard cell area (or in the power lines areas).

Figure 5:
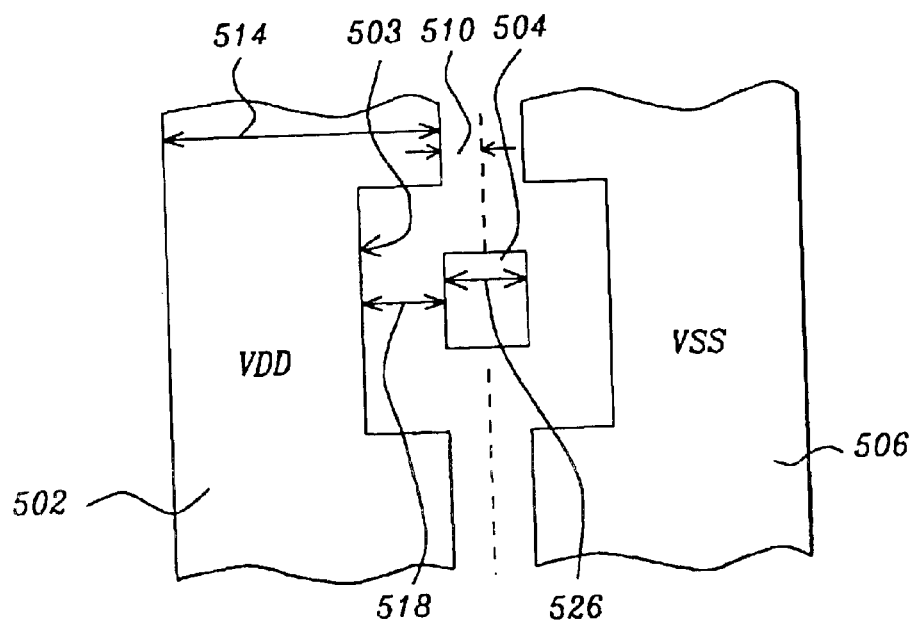
FIG. 5 shows a top down view of narrow metal lines 502 506 having notches 503 that make room for the pin 504.

FIG. 5 shows a top down view of narrow metal lines 502 506 having notches 503 that make room for the pin 504. An example of dimension is as follows: (typical 0.15 μm process dimensions).

width 514 is between 7 and 9 μm.

space 510 space 518 pin 504 width 526 is between 0.23 and 0.25 μm.

The main point of FIG. 5 is to show that the size of the notch is <5% of the original width.

Figure 6:
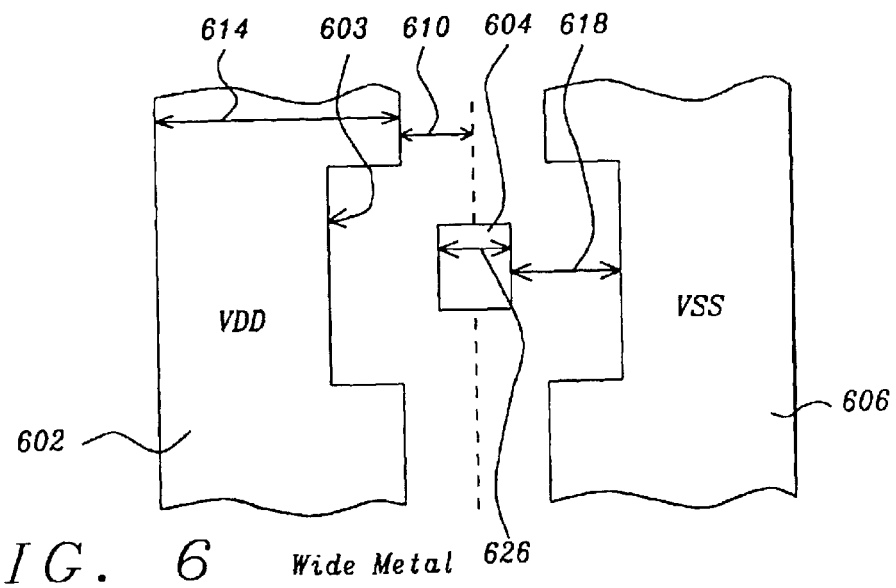
FIG. 6 shows a top down view of wide metal lines 602 606 having notches 603 that make room for the pin 604.

FIG. 6 shows a top down view of wide metal lines 602 606 having notches 603 that make room for the pin 604. An example of dimension is as follows:

width 614 is between 9 and 11 μm.

space 610 space 618 pin 604 width 626 is between 0.23 and 0.25 μm.

The difference between FIGS. 5 and 6 is to show one case for wide metal and another for non-wide metal which have different spacing rules.

In the above description numerous specific details are set forth such as thicknesses, etc, in order to provide a more thorough understanding of the present invention. It will be obvious, however, to one skilled in the art that the present invention may be practiced without these details. In other instances, well known process have not been described in detail in order to not unnecessarily obscure the present invention.

While the invention has been particularly shown and described with reference to the preferred embodiments thereof, it will be understood by those skilled in the all that various changes in form and details may be made without departing from the spirit and scope of the invention. It is intended to cover various modifications and similar arrangements and procedures, and the scope of the appended claims therefore should be accorded the broadest interpretation so as to encompass all such modifications and similar arrangements and procedures.

What is claimed is:

1. A wiring structure of buffer cells in power line areas between macro cells in a semiconductor device; comprising:

a) a substrate with a macro block area and a standard cell area; macro cells in said macro block area; said macro cells separated by power line areas; providing a driver located in said standard cell area;

b) at least a buffer cell in said power lines area;

c) a plurality of interconnect layers over said substrate; said interconnect layers interconnecting devices within said macro cells and said standard cells and providing sublevel power lines;

d) a power level layer over said plurality of interconnect layers; said power level layer comprised of VDD and VSS lines running in parallel over said power line area between said macro cells; said power level layer comprised of a pin to connect to said buffer cell; said pin located in said power line area wherein said VDD and VSS lines have notch areas where said VDD and VSS lines do not contact said pin, wherein said notch area is less than five percent of said VDD or VSS line in width;

e) a signal line over said power level layer and said macro block area; said signal line having contacts to said pin and are connected to said buffer cell; said signal line connected to said driver located in said standard cell area.

2. A wiring structure with buffer cells in power line areas between macro cells in a semiconductor device; and forming drivers in macro block areas; comprising:

a) a substrate with a macro block area and a standard cell area; providing macro cells in said macro block area; said macro cells separated by power line areas;

b) at least a buffer cell in said power lines areas; providing drivers in said macro cells;

c) a plurality of interconnect layers over said substrate; said interconnect layers interconnecting devices within said macro cells and said standard cells and providing sublevel power lines;

d) a power level layer over said plurality of interconnect layers; said power level layer comprised Of VDD and VSS lines running in parallel over said power line area between said macro cells; said power level layer comprised of a pin to connect to said buffer cell; said pin located in said power line area wherein said VDD and VSS lines have notch areas where said VDD and VSS lines do not contact said pin, wherein said notch area is less than five percent of said VDD or VSS line in width;

e) a signal line over said power level layer and said macro block area; said signal line having contacts to said pin and are connected to said buffer cell; said signal line connected to a driver located in said macro block area.

* * * * *